(12) United States Patent
Zhang et al.

(10) Patent No.: US 11,984,700 B2
(45) Date of Patent: May 14, 2024

(54) INTEGRATED LASER AND MODULATOR SYSTEMS

(71) Applicant: Microsoft Technology Licensing, LLC, Redmond, WA (US)

(72) Inventors: Yifei Zhang, Bellevue, WA (US); Thomas Hamish Barter, Seattle, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 17/960,679

(22) Filed: Oct. 5, 2022

(65) Prior Publication Data
US 2024/0120707 A1 Apr. 11, 2024

(51) Int. Cl.
H01S 5/026 (2006.01)
G02B 27/01 (2006.01)
(Continued)

(52) U.S. Cl.
CPC ........ *H01S 5/0265* (2013.01); *G02B 27/0172* (2013.01); *G02F 1/17* (2013.01); *G09G 3/02* (2013.01); *H01S 5/0085* (2013.01); *H01S 5/0427* (2013.01); *G02B 6/0031* (2013.01); *G02B 2027/0112* (2013.01); *G02B 2027/0118* (2013.01); *G02B 2027/014* (2013.01); *G02B 2027/0178* (2013.01); *G02F 2201/06* (2013.01); *G02F 2203/48* (2013.01);
(Continued)

(58) Field of Classification Search
CPC .... H01S 5/0265; H01S 5/0427; H01S 5/0085; H01S 5/0071; H01S 5/06256; G02B 27/0172; G02B 27/017; G02F 1/17; G02F 2203/48
See application file for complete search history.

(56) References Cited

U.S. PATENT DOCUMENTS 5,369,415 A 11/1994 Richard et al.
6,295,308 B1 9/2001 Zah
(Continued)

OTHER PUBLICATIONS

"International Search Report and Written Opinion Issued in PCT Application No. PCT/US23/030892", Mailed Date: Nov. 16, 2023, 12 Pages.

*Primary Examiner* — Xuemei Zheng
(74) *Attorney, Agent, or Firm* — Workman Nydegger

(57) ABSTRACT

A display system includes an integrated laser and modulator device and a display assembly. The integrated laser and modulator device includes a laser component configured to facilitate light emission responsive to applied current and a modulator component configured to selectively modulate light responsive to applied signal. The modulator component is integrally coupled to the laser component via a bridging structure that intervenes between the laser component and the modulator component. At least a portion of the bridging structure facilitates power reflectivity into a laser cavity of the laser component. The bridging structure facilitates transmission of light emitted by the laser component into the modulator component for modulation by the modulator component to provide modulated light. The display assembly is configured to direct the modulated light provided by the integrated laser and modulator device to illuminate pixels to form an image.

17 Claims, 15 Drawing Sheets

(51) Int. Cl.
    *G02F 1/17*     (2019.01)
    *G09G 3/02*     (2006.01)
    *H01S 5/00*     (2006.01)
    *H01S 5/042*     (2006.01)
    *F21V 8/00*     (2006.01)

(52) U.S. Cl.
    CPC ..... *G09G 2310/06* (2013.01); *G09G 2320/02* (2013.01); *G09G 2320/041* (2013.01); *G09G 2330/021* (2013.01)

(56) References Cited

U.S. PATENT DOCUMENTS

| | | | |
|---|---|---|---|
| 9,059,801 B1 * | 6/2015 | Blauvelt | H04B 10/505 |
| 10,770,865 B1 | 9/2020 | Shahin et al. | |
| 2020/0274324 A1 * | 8/2020 | Dykaar | H01S 5/06256 |
| 2020/0373734 A1 * | 11/2020 | Shahin | H01S 5/0225 |
| 2021/0088657 A1 * | 3/2021 | Shah | G01S 17/42 |
| 2021/0281047 A1 * | 9/2021 | Shahin | H01S 5/3414 |
| 2022/0190550 A1 * | 6/2022 | Hjartarson | H01S 5/1032 |
| 2022/0360038 A1 * | 11/2022 | Ishaug | G02F 1/017 |

* cited by examiner

INTEGRATED LASER AND MODULATOR SYSTEMS

BACKGROUND

Mixed-reality (MR) systems, including virtual-reality and augmented-reality systems, have received significant attention because of their ability to create truly unique experiences for their users. For reference, conventional virtual-reality (VR) systems create a completely immersive experience by restricting their users' views to only a virtual environment. This is often achieved, in VR systems, through the use of a head-mounted device (HMD) that completely blocks any view of the real world. As a result, a user is entirely immersed within the virtual environment. In contrast, conventional augmented-reality (AR) systems create an augmented-reality experience by visually presenting virtual objects that are placed in or that interact with the real world.

AR systems typically include transparent display elements through which light for forming images is projected for viewing by an end user. For example, a display element may comprise a set of transparent waveguides (e.g., glass, plastic, or other transparent plates) and a light projection system (e.g., including one or more lasers and one or more microelectromechanical system mirrors) that projects light toward the set of transparent waveguides. The set of transparent waveguides may receive and expand the input light in multiple dimensions to provide a field of view (FOV) through which an image may be viewed by a user. The set of transparent waveguides may also transmit light from the user's real-world environment, enabling the user to perceive the virtual imagery in combination with the real-world environment.

One limitation of many existing HMDs is the dynamic range (DR) of the display. For an optimal user experience, the display image should ideally be indistinguishable from the real world. However, human vision can perceive a much wider range of contrast (e.g., about 21 stops) than the DR afforded by typical HMDs (e.g., within a range of about 8 to 12 stops).

Such DR issues are often exacerbated in HMDs with laser-based displays (e.g., AR HMDs, as discussed briefly above). In such displays, the pixel brightness ranges from close to a laser threshold luminance to the laser maximum luminance. In many instances, a significant quantity of pixels in displayed imagery across various applications represent low luminance content that is close to the laser threshold luminance. Having a limited DR near the laser threshold luminance presents many challenges for accurately representing low luminance content. For example, the laser threshold current (i.e., the current at which the laser lases coherent light) is temperature dependent and can be undesirably and/or unexpectedly shifted as a result of thermal and/or electrical cross talk between different emitters (and/or other components). Such unwanted shifting of the laser threshold current can make accurate laser power control difficult to achieve (especially at low laser power for presenting low luminance content).

The subject matter claimed herein is not limited to embodiments that solve any challenges or that operate only in environments such as those described above. Rather, this background is only provided to illustrate one exemplary technology area where some embodiments described herein may be practiced.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Disclosed embodiments are generally directed to laser and modulator control systems for mitigating laser errors. Such laser and modulator control systems may be implemented in MR devices to facilitate improved dynamic range, which may contribute to improved user experiences. Although the present disclosure focuses, in at least some respects, on implementation of laser and modulator control systems in MR devices (e.g., AR HMDs), the principles discussed herein may be implemented in other contexts. Furthermore, although some examples discussed herein focus, in at least some respects, on control of integrated laser and modulator devices, the control principles discussed herein may be utilized in conjunction with any type of laser and modulator device (e.g., where the laser and modulator are implemented as distinct entities/devices).

The typical relationship between optical power (or "light power" as used herein) and input current for a laser involves a threshold point ("laser threshold", "laser current threshold", "knee point", or simply "knee"). For input currents below the knee, very little stimulated light is emitted by the laser. For currents above the knee, the light power rises linearly with the input current.

When operating in a display system, a particular light power may be demanded or requested from a laser. Ideally, the light power output by the laser would exactly match the requested or demanded light power by applying an input current to the laser that is associated with the requested light power (according to the light power-current relationship).

However, light power output by a laser is often inaccurate, especially for low brightness levels (i.e., low requested light power levels) where the input current is close to the knee region (e.g., near the threshold current) of the light-power current relationship for the laser. Such inaccuracy can result in the requested brightness for some pixels being different than the actual brightness delivered to the pixels, which can be noticeable to users and degrade user experiences.

Figure 1:
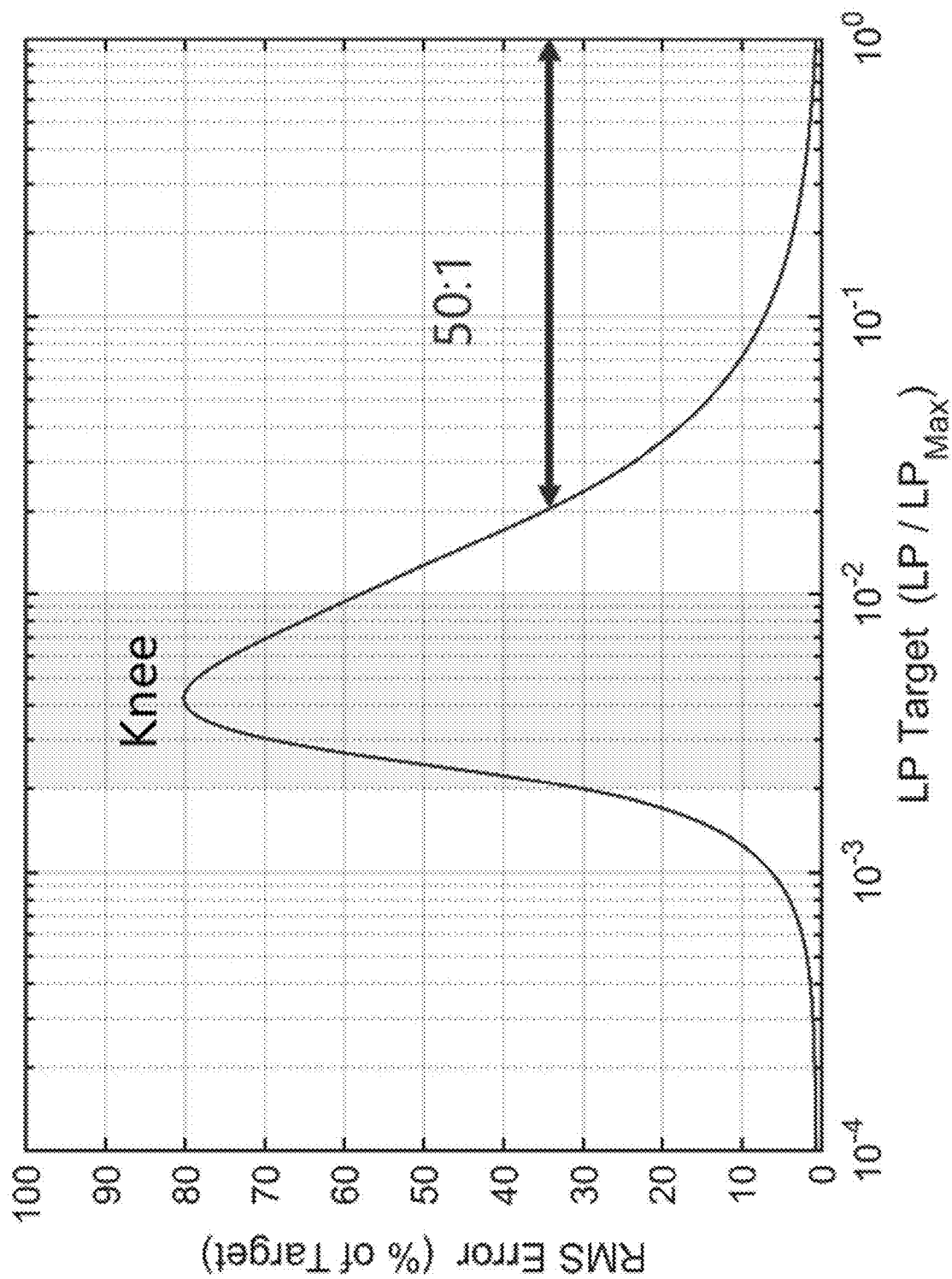
FIG. 1 illustrates an example graph depicting RMS error versus target light power for a conventional laser component of a conventional laser-based display system.

As noted above, the error or inaccuracy in light power output by a laser is often greater for brightness levels that are closer to the laser threshold or knee region. At least some of this increased amount of error associated with the knee region results from the laser threshold current being sensitive to heat, which can cause the laser threshold to shift exponentially. Effects such as laser self-heating and adjacent emitter heating can result in shifts of laser threshold current (and the entire light power-current curve or L-I curve) and cause error in the output light power. FIG. 1 illustrates an example graph depicting RMS error for output light power of a laser relative to target light power output for a laser. As is evident from FIG. 1, the light power error increases for target light power associated with the knee region and reduces for greater target light power.

The difficulty of light power control in the low light power range (as explained above) combined with the limitation on maximum light power obtainable from laser diodes results in a limited dynamic range for pixels illuminated by lasers used in laser-based display systems (e.g., MR HMDs). FIG. 1 depicts an available dynamic range of 50:1 including target light powers associated with currents between the knee region and maximum laser current. However, in many instances, only a portion of the entire dynamic range of the laser is usable to accommodate other control needs such as corrections for waveguide nonuniformity and/or accounting for turn-on delay, resulting in a tight requirement for current control steps that can further contribute to current control challenges. For instance, current control steps can be on the order of $\mu A$, while shifts in knee region and L-I curve caused by temperature can be in the mA range.

At least some disclosed embodiments are directed to components, devices, processes, systems and/or techniques for addressing the uncertainty in the input laser current required to get a desired/target light power. Implementation of the disclosed embodiments can improve laser control precision for display systems and/or other laser-based applications.

Integrated Laser and Modulator Systems

At least some disclosed embodiments can facilitate an increase in dynamic range and improvement to laser control precision by implementing a modulator with the laser. Modulators have various applications, such as to maintain constant output light intensity in measurements systems or to load information into an optical frequency carrier. In contrast with conventional modulator uses, at least some disclosed embodiments utilize a modulator integrated with a laser to precisely control pixel brightness in a display system. An integrated device can include a laser integrated with a modulator that acts as an attenuator (e.g., utilizing effects such as quantum-confined Stark effect where the light absorption spectrum is changed by an external electric field) or a low-power laser integrated with a modulator that acts as an amplifier (e.g., a semiconductor optical amplifier (SOA)).

Figure 2:
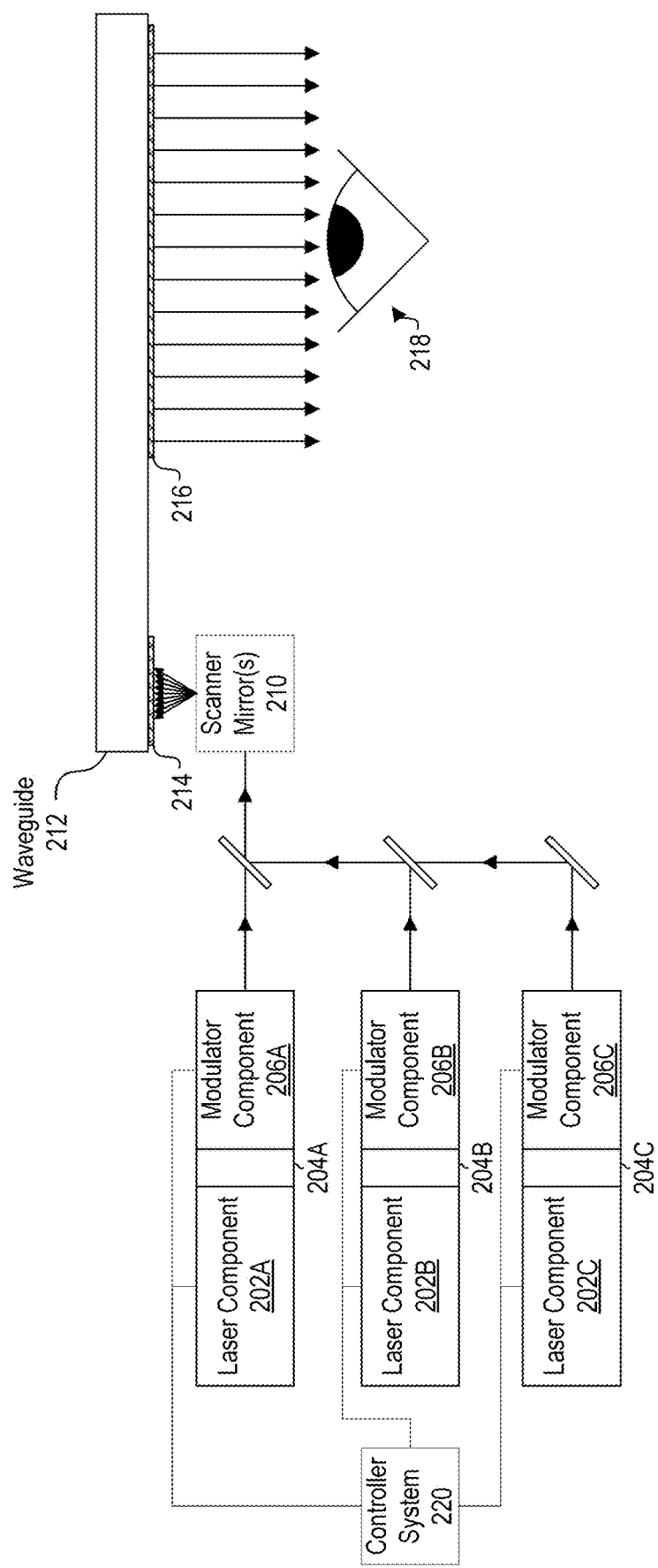
FIG. 2 illustrates conceptual representations of example components of a display system that utilizes an integrated laser and modulator device.

FIG. 2 illustrates conceptual representations of example components of a display system that utilizes integrated laser and modulator devices. In particular, FIG. 2 illustrates an integrated laser and modulator device that includes a laser component 202A, a modulator component 206A. The laser component 202A facilitates light emission responsive to applied current, and the modulator component selectively modulates light responsive to applied signal (e.g., voltage signal or a current signal).

In the example of FIG. 2, the modulator component 206A is integrally coupled to the laser component by a bridging structure 204A that intervenes between the laser component 202A and the modulator component 206A. Part of the bridging structure 204A facilitates power reflectivity into the laser cavity of the laser component 202A. The bridging structure 204A facilitates transmission of light emitted by the laser component 202A into the modulator component 206A for modulation of the transmitted light by the modulator component 206A, thereby providing/outputting modulated light (as indicated by the arrow extending from the modulator component 206A).

As indicated above, the modulator component 206A may operate as an attenuator by selectively attenuating (responsive to applied voltage) the light received from the laser component 202A via the bridging structure 204A (e.g., via quantum-confined Stark effect techniques). Alternatively, the modulator component 206A may operate as an amplifier (e.g., an SOA) by selectively amplifying (responsive to applied current) the light received from the laser component 202A via the bridging structure 204A. Thus, the modulated light output by the integrated laser and modulated device may comprise attenuated light, amplified light, or light unmodified by the modulator component 206A (e.g., when no signal is selectively applied to the modulator component 206A). In some instances, the modulator component 206A is configured to reversibly operate as a modulator or an attenuator.

Figure 3:
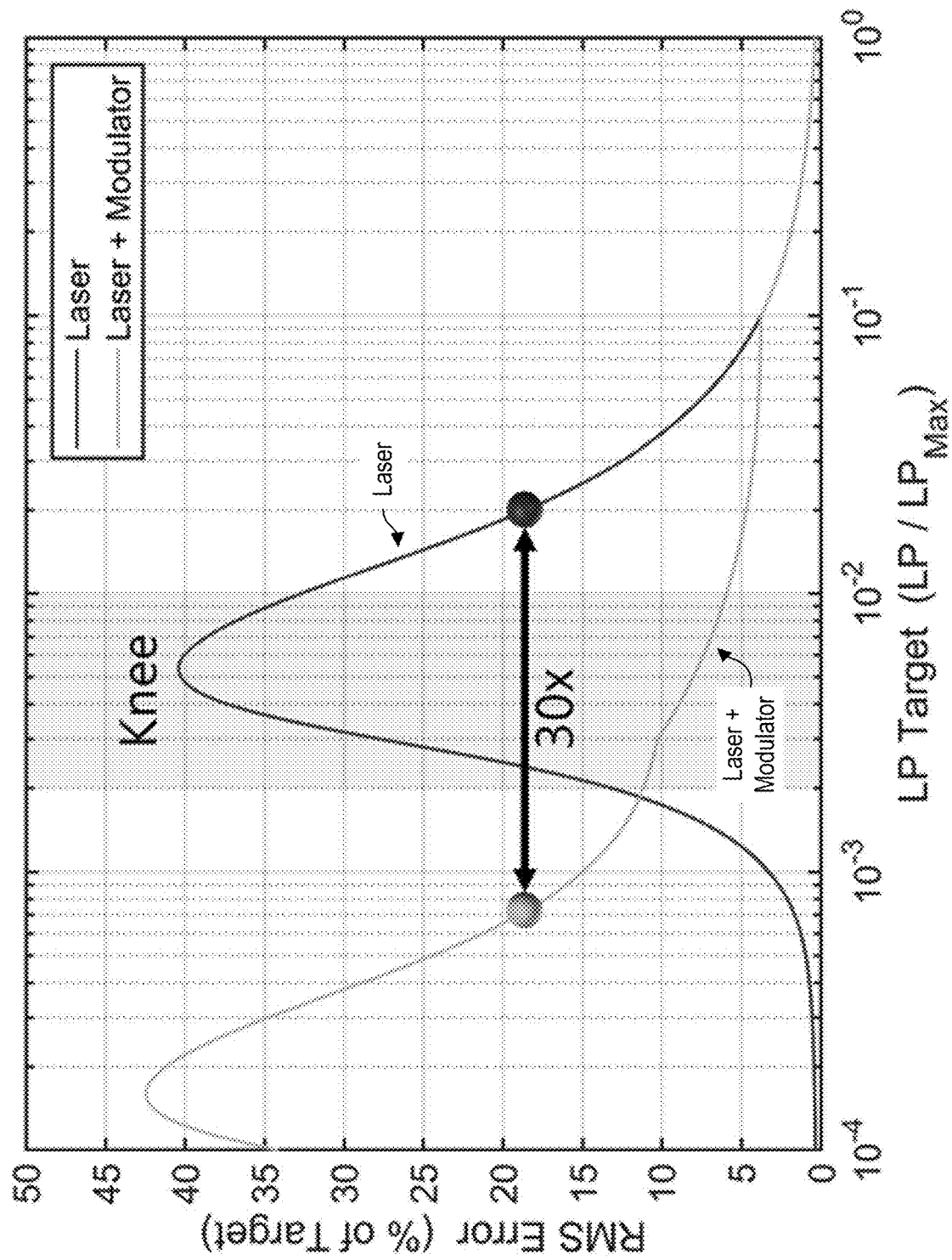
FIG. 3 illustrates an example graph depicting RMS error versus target light power for a laser and modulator device of a display system.

Utilizing the modulator component 206A to selectively modify the light output by the laser component 202A may facilitate a reduced light power error for light output by the integrated laser and modulator device. Such a reduction in light power error may facilitate improved dynamic range for display systems (e.g., where the integrated laser and modulator device illuminates pixels for a display system). For instance, the laser component 202A may be supplied with input current associated with target light power above the knee region as shown in FIG. 1, thereby achieving a lower light power error than the light power error associated with target light powers within the knee region (as indicated in FIG. 1). While operating the laser component 202A within such a range of input currents (above the knee region), the modulator component 206A may be operated as an attenuator to enable further target light power reduction (e.g., to control brightness) while maintaining avoidance of the high-error knee region. Such functionality may enable an increase of dynamic range for display systems by enabling use of light powers between the maximum target light power associated with the laser component 202A and the minimum (attenuated) target light power achievable via the modulator component 206A (while the laser component 202A is operated above the knee region) while avoiding the high-error knee region. Such an increase in dynamic range is depicted in FIG. 3, where operation of the modulator component 206A as an attenuator while the laser component 202A is operated above the knee region effectively shifts the light power error versus target light power curve, providing an additional range of achievable target light power values with relatively low light power error (in the example of FIG. 3, achieving a 30× increase in dynamic range).

Operation of the modulator component 206A as an amplifier rather than an attenuator can similarly facilitate an increase in dynamic range. For instance, while operating the laser component 202A above the knee region, the modulator component 206A may be operated as an amplifier to enable further increase in target light power above the maximum achievable by the laser component 202A operating alone (while still maintaining avoidance of the high-error knee region). Such an increase in the maximum achievable target light power may contribute to increased dynamic range (e.g., for controlling pixel brightness in displays).

In this regard, in view of the foregoing, modulation by the modulator component 206A of the light emitted by the laser component 202A may mitigate the effects of light power error associated with the laser component 202A (e.g., by avoiding the high light power error associated with the knee region of the laser component 202A). Such mitigation of the effects of light power error associated with the laser component 202A may contributed to an increased dynamic range for use in display systems (e.g., to illuminate pixels for presenting images).

To facilitate operation of the integrated laser and modulator device to achieve improved dynamic range, the laser component 202A and the modulator component 206A may be independently controlled to enable application of different signals to the different components. FIG. 2 accordingly illustrates a controller system 220 in communication with the laser component 202A and the modulator component 206A to selectively apply voltage and/or current to the laser component 202A and the modulator component 206A and/or selectively modify voltage and/or current applied to the laser component 202A and the modulator component 206A. As will be described in more detail hereinbelow, the controller system 220 may control the voltage and/or current applied to the laser component 202A and the modulator component 206A in accordance with a signal control route that defines different combinations of input signals for different target light powers (or different light power demands).

FIG. 2 illustrates additional aspects of operation of the integrated laser and modulator device within the context of a display assembly (e.g., a display assembly of a HMD). A display assembly may include various components for directing the modulated light output by the integrated laser and modulator device to illuminate pixels for forming an image. In the example of FIG. 2, a display assembly includes a scanner mirror 210, which receives light output by the laser component 202A and modulator component 206A and reflects the received light to illuminate pixels for forming an image. FIG. 2 illustrates the scanner mirror 210 reflecting the light from the laser component 202A and modulator component 206A toward a waveguide 212 which includes an input diffractive optical element 214 (DOE 214) for in-coupling the light from the scanner mirror 210 to cause internal reflection of the received light within the waveguide 212. The light internally reflects through the waveguide 212 toward a second DOE 216, which outcouples the internally reflected light toward an eye 218 of a user (and/or another type of image sensor/detector). One will appreciate, in view of the present disclosure, that other types of coupling elements aside from DOEs may be utilized. In this way, the light projected by the laser component 202A and modulator component 206A may illuminate image pixels for perception by the eye 218 of the user. Alternatively, the scanner mirror may reflect the light received from the laser component 202A and the modulator component 206A toward a display panel, such as a projection screen viewable by a user.

FIG. 2 furthermore illustrates that multiple integrated laser and modulator devices may be utilized in conjunction with one another to facilitate image generation/presentation. In particular, FIG. 2 illustrates an additional integrated laser and modulator device including laser component 202B, bridging structure 204B, and modulator component 206B, and another additional integrated laser and modulator device including laser component 202C, bridging structure 204C, and modulator component 206C. Each integrated laser and modulator device of FIG. 2 is controllable via the controller system 220, as indicated in FIG. 2 by the lines extending from the controller system 220 toward the laser components 202A, 202B, and 202C and the modulator components 206A, 206B, and 206C. Each of the different integrated laser and modulator devices may be associated with a respective color channel for forming colored image pixels of an output image. For instance, for a red, green, blue (RGB) color scheme, the first integrated laser and modulator device (including laser component 202A, bridging structure 204A, and modulator component 206A) may be associated with a red color channel, the second integrated laser and modulator device (including laser component 202B, bridging structure 204B, and modulator component 206B) may be associated with a green color channel, and the third integrated laser and modulator device (including laser component 202C, bridging structure 204C, and modulator component 206C) may be associated with a blue color channel. Red, green, and blue (modulated) light output by the different integrated laser and modulator devices may be directed toward the scanner mirror 210 of the display assembly (e.g., via dichroic mirrors as depicted in FIG. 2) to facilitate illumination of pixels with particular pixel color values to form an image perceivable by the eye 218 of the user.

One will appreciate, in view of the present disclosure, that the particular configuration shown in FIG. 2 is provided by way of example only and is not limiting of the present disclosure. For instance, a display system that implements laser and modulator components may include different numbers of lasers and/or modulators for each color channel (e.g., for each color channel, multiple lasers optically coupled to a single modulator, or, for each color channel, multiple lasers with each optically coupled to a respective modulator) or may include modulators that receive light from lasers associated with different color channels (e.g., where the modulator is not color-sensitive).

Design Aspects of Integrated Laser and Modulator Devices

An integrated laser and modulator device may be designed in various ways to facilitate the functionality discussed herein. In one example, the epitaxial layers of the waveguide of the laser component may be extended to form the modulator component, and the modulator component may be implemented in such a case as an electro-absorption modulator or SOA. A modulator component may alternatively formed via the regrowth technique, where the epitaxial layers used in the modulator are grown to be different than the epitaxial layers of the laser diode.

As noted above, an integrated laser and modulator device can include a bridging structure that intervenes between the laser component and modulator component to facilitate monolithic integration of the laser component with the modulator component. In some instances, the bridging structure advantageously removes the need for bulkier and/or more lossy heterogeneous integration platforms for integrating the laser component with the modulator component, such as edge coupling, grating coupling, ball lenses, etc. In some implementations, the bridging structure includes various features, such as: (i) providing a level of power reflectivity into the laser cavity of the laser component (e.g., about 10% for red lasers, about 50% for blue and/or green lasers), (ii) operating to transfer remaining power (un-reflected power) from the laser component to the modulator component with minimal coupling loss (e.g., with a coupling loss less than about 3 dB, in some instances), and (iii) including a spectral bandwidth that does not hinder the overall spectrum of output light (e.g., the spectral bandwidth of the bridging structure may be designed to spectrally filter the laser power to contribute to the overall spectrum of output light, or may be designed to be broad enough to enable the overall spectrum of output light to be mainly determined by the laser gain spectrum).

Figure 4A:
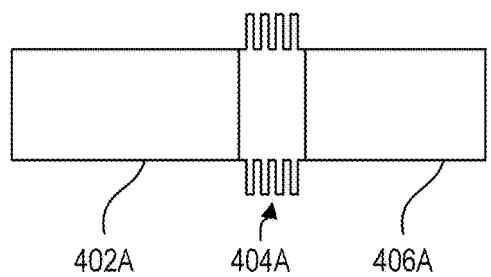
FIGS. 4A through 4D illustrate conceptual representations of example aspects of an integrated laser and modulator device.
Figure 4B:
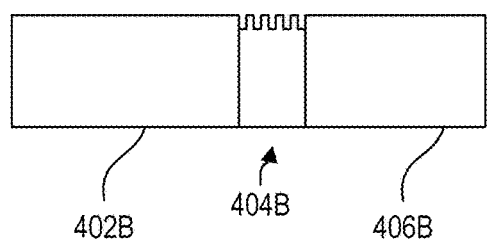

FIGS. 4A through 4D illustrate conceptual representations of example aspects of bridging structures of integrated laser and modulator devices. In some implementations, a bridging structure includes one or more Bragg gratings designed for a particular power reflection into the laser component and a particular power transmission into the modulator component. Such Bragg gratings may comprise distributed Bragg reflectors (DBRs), which may be designed for narrow bandwidths. FIG. 4A illustrates a top view of an integrated laser and modulator device, which includes a laser component 402A, a modulator component 406A, and a bridging structure 404A implemented in the form of DBRs incorporated on opposing sidewalls of the of the waveguide of the laser component 402A. FIG. 4B illustrates a side view of an integrated laser and modulator device, which includes a laser component 402B, a modulator component 406B, and a bridging structure 404B implemented in the form of a DBR implemented on the top cladding layer of the laser component 402B. DBRs may be designed to achieve different reflection and/or transmission bandwidths, which may be centered at specific wavelengths.

In addition, or as an alternative, to Bragg gratings, a bridging structure may comprise other types of structures, such as one or more integrated freeform optical couplers, free space optical couplers, and/or others.

Figure 4C:
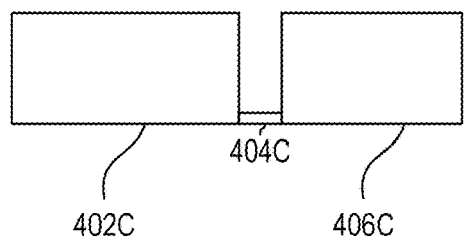

In some implementations, such as where the overall spectrum of output light is to be determined by the laser gain spectrum, the bridging structure of an integrated laser and modulator device may be implemented as a gap between the laser component and the modulator component. FIG. 4C illustrates a side view of an integrated laser and modulator device, which includes a laser component 402C, a modulator component 406C, and a bridging structure 404C implemented in the form of an etched notch between the laser component 402C and the modulator component 406C, thereby providing a gap therebetween. An etched notch between the laser component 402C and the modulator component 406C may advantageously be easily fabricated. The gap between the laser component 402C and the modulator component 406C may be designed to have a particular power reflection and transmission with a broad spectral bandwidth (e.g., broader than the laser gain spectrum, enabling the overall spectrum of output light to be chiefly determined by the laser gain spectrum). For example, the opposing walls of the gap formed from the etched notch may have different coatings disposed thereover, with one side (the side abutting the laser cavity of the laser component) including an at least partially reflective coating, and with the other side (the side abutting the modulator component) including an at least partially anti-reflective coating disposed thereover. The width of the gap and/or the filling material of the gap may be selected to achieve a desired profile of power reflection into the laser component and power transmission into the modulator component.

Figure 4D:
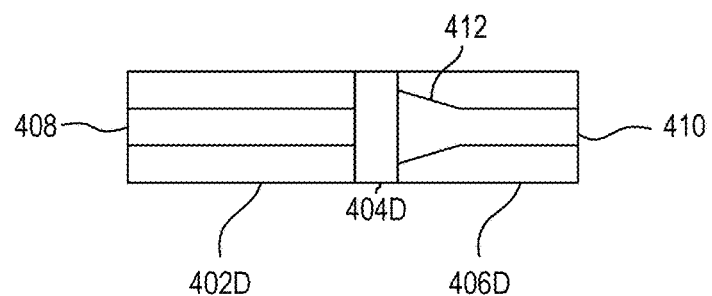

The 3D structure of a bridging structure implemented as a gap may induce mode mismatch and/or coupling loss from the laser component to the modulator component. A small gap size (e.g., within a range of about 0.5 µm) may mitigate degradation of coupling efficiency from the laser component to the modulator component. However, producing a gap between the laser component and the modulator component with a small gap size can involve challenging fabrication techniques and/or can introduce challenges for facet coating. In some instances, to address such concerns, the modulator component may include a tapered waveguide, which may mitigate the coupling loss across the gap from the laser component to the modulator component. FIG. 4D illustrates a top view of an example integrated laser and modulator device that includes a laser component 402D (with a waveguide 408), a bridging structure 404D implemented as an etched notch forming a gap, and a modulator component 406D that includes a waveguide 410 with a tapered region 412 on the input side of the modulator component 406D. Different degrees of waveguide tapering (e.g., different taper widths) on the modulator component 406D are associated with different improvements in coupling efficiency from the laser component 402D to the modulator component 406D (e.g., relative to a non-tapered waveguide).

Light Power Error Reduction and Signal Control of Integrated Laser and Modulator Devices The light power error associated with the laser component (e.g., induced by the shifting of L-I curve of the laser component, which can be caused by changes in temperature) is calculated differently than the light power error induced by the signal of the modulator component. For light power error induced by shifting of the L-I curve of the laser component, error can be calculated by $$\text{Error}_{laser} = \Delta L/L = \Delta I_{th} \times d(\ln(L))/dI_{laser}$$

where $\Delta I_{th}$ is a constant value corresponding to the shift of laser threshold current. The term $d(\ln(L))/dI_{laser}$ corresponds to the derivative of $\ln(L)$, which means the steeper the $\ln(L)$ curve, the higher the percentage error of light power.

Light power error induced by the modulator signal may be regarded as linearly dependent on the modulator signal $I_{modulator}$. For example, assuming a 7% current error, then $\Delta I_{modulator} = 7\% * I_{modulator}$. As a result, the error percentage in light power can be calculated by:

$$\text{Error}_{modulator} = \frac{\Delta L}{L} = \Delta I_{modulator} \times \frac{d(\ln(L))}{dI_{modulator}} = 7\% * I_{modulator} \times \frac{d(\ln(L))}{dI_{modulator}}.$$

Figure 5:
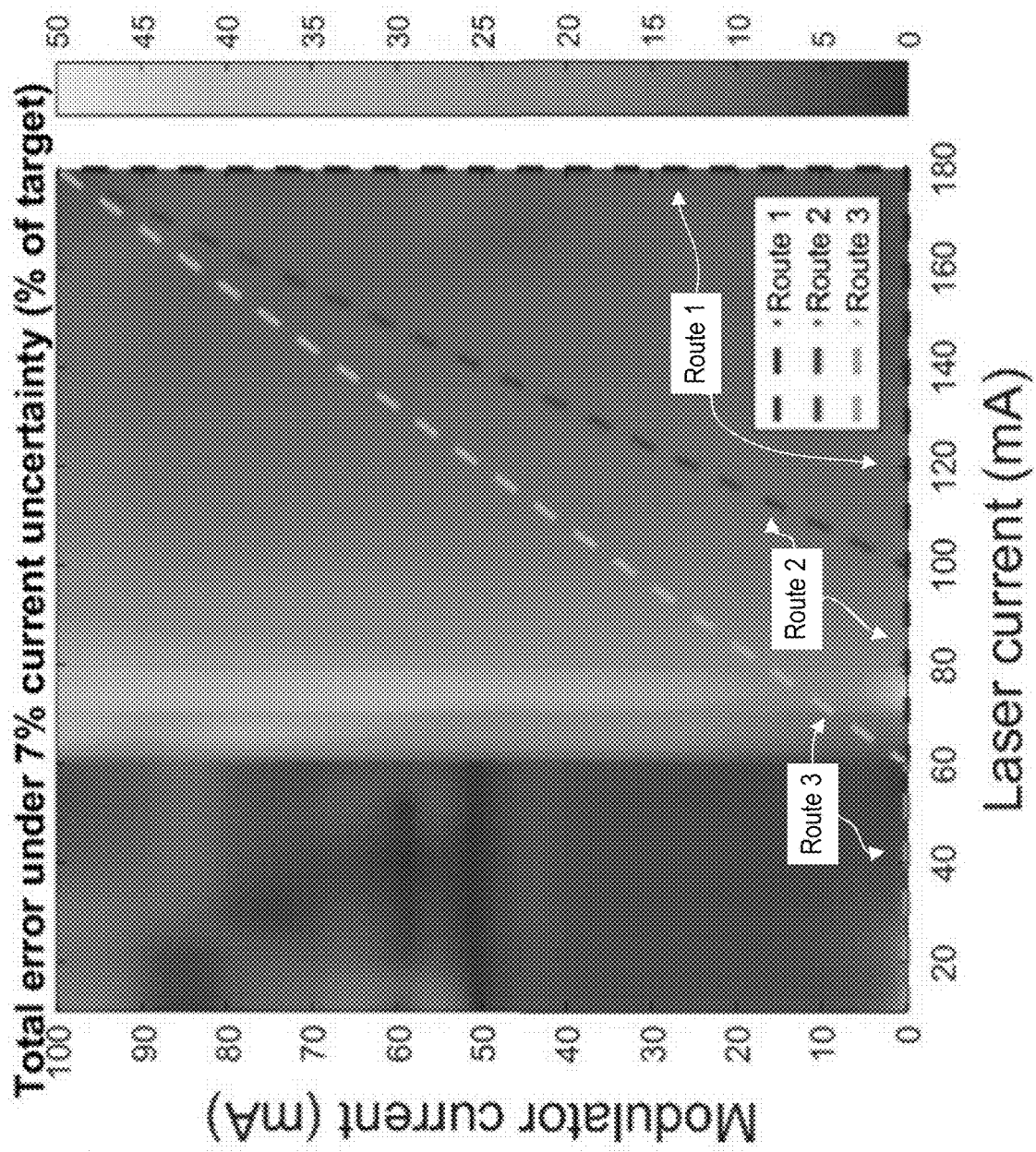
FIG. 5 illustrates an example mapping of the combined effects of laser current and modulator signal on light power error, as well as example routes for increasing laser current and modulator signal to achieve target light power.

FIG. 5 shows calculated light power error for an example integrated laser and modulator device, with darker regions corresponding to lower light power error, and lighter regions corresponding to greater light power error. As is evident from FIG. 5, the light power error is higher around the knee region (e.g., close to the threshold current).

With two individually controlled components, namely the laser component and the modulator component, specific routes (i.e., signal control routes) to increase the light power (e.g., to achieve a target light power responsive to a request or demand for a target light power) may be implemented to strategically increase the input signals of the two components. A signal control route may define different combinations of laser component input current and modulator component input signal to meet different light power demands/ requests. Different signal control routes will result in different power consumption profiles for an integrated laser and modulator device. Thus, different signal control routes may be chosen to best match power consumption requirements and light power requirements. FIG. 5 illustrates three example routes (labeled "Route 1", "Route 2", and "Route 3") that define how laser component input current and modulator component input signal may be selected to meet different target light powers.

Figure 6A:
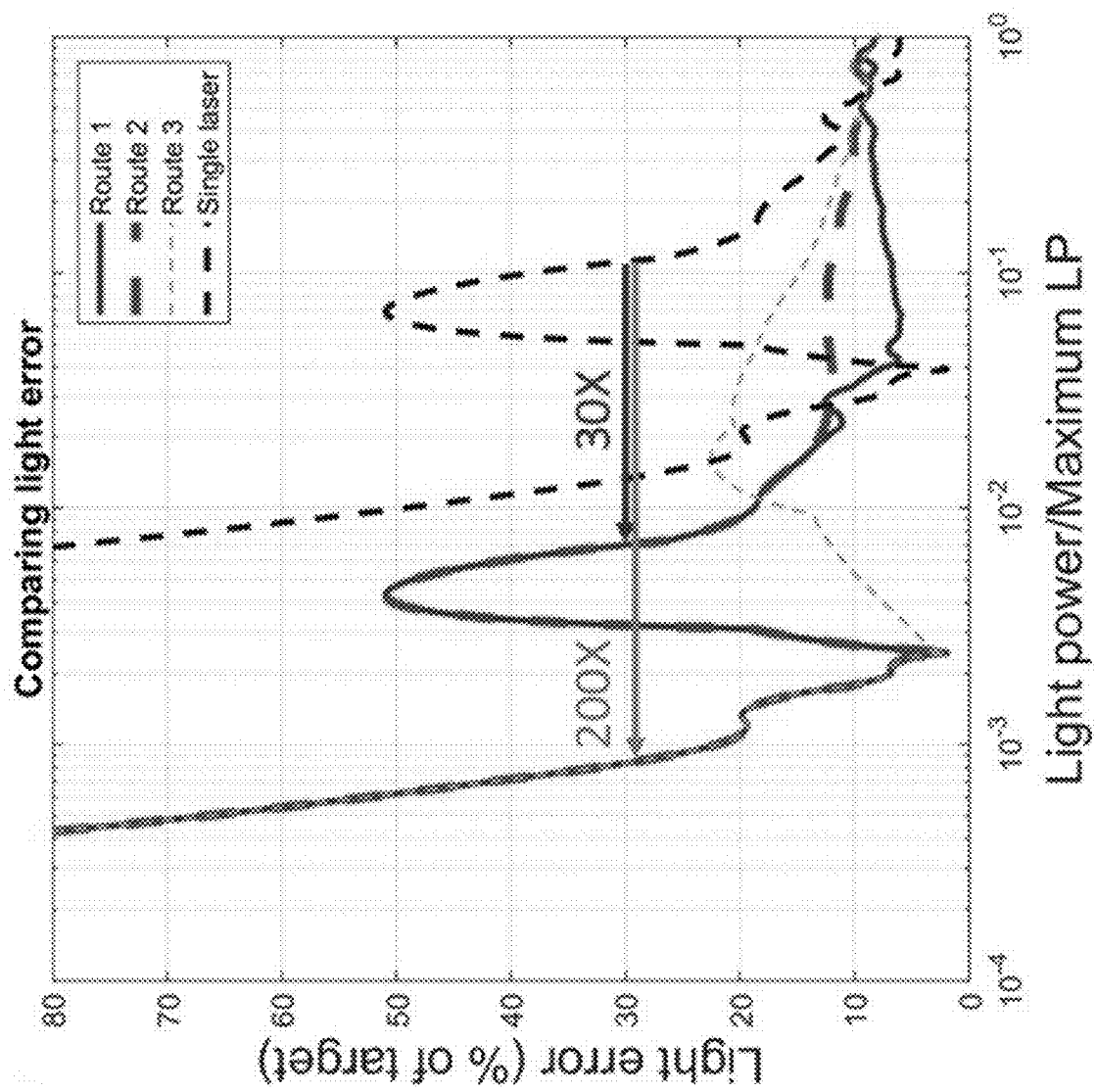
FIG. 6A illustrates an example graph depicting light power error versus target light power for the example routes shown in FIG. 5.
Figure 6B:
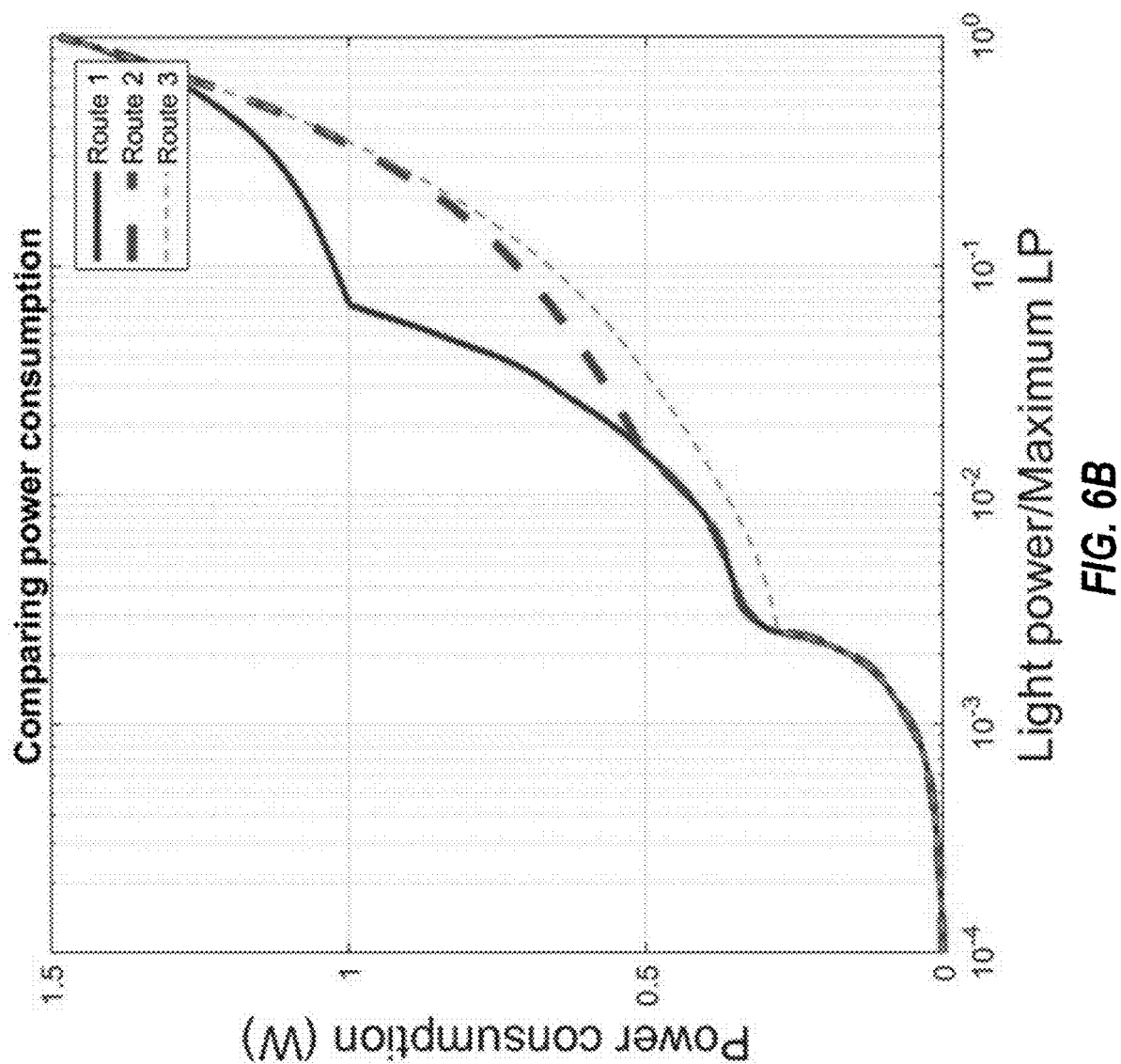
FIG. 6B illustrates an example graph depicting power consumption versus target light power for the example routes shown in FIG. 5.

FIG. 6A illustrates an example graph depicting light power error versus target light power for a single laser (for comparison) and for the example signal control routes shown in FIG. 5. FIG. 6A demonstrates the dynamic range improvement facilitated by the different signal control routes relative to the dynamic range achievable by a single laser. Dynamic range improvement may be assessed on the basis of a selected error requirement. For example, the arrows in FIG. 6A indicate that for a maximum error of 30%, Routes 1 and 2 can facilitate an improvement in dynamic range of about 30× (e.g., corresponding to about 4.9 bits), whereas Route 3 can facilitate an improvement in dynamic range of about 200× (e.g., corresponding to about 7.6 bits). For a maximum error of 24%, Routes 1 and 2 provide greater improvement to dynamic range than Route 3. FIG. 6B graphs the power consumption versus target light power for Routes 1, 2, and 3. As is evident from FIG. 6B, Route 3 is the most energy-efficient method to control the laser and modulator component input signals (relative to Routes 1 and 2). The power consumption used in FIG. 6B is peak power consumption, rather than the average power under pulsing condition.

In view of FIGS. 5, 6A, and 6B and their attendant discussion, different signal control routes may be chosen for increasing input signal (for the laser component and the modulator component) and light power. Routes may be selected on the basis of light power error reduction and power consumption. As indicated above, a selected signal control route may be implemented by a controller system 220 (referring again to FIG. 2) in controlling input signal waveforms provided to one or more laser components and/or modulator components.

For example, a controller system 220 may obtain or receive a light power demand or request, which may be associated with a pixel value for forming an image. The controller system 220 may then determine a laser component input current waveform and a modulator component input signal waveform based upon the signal control route (e.g., by determining the laser component input current waveform and modulator component input signal waveform defined by the signal control route for achieving the demanded or requested light power). The controller system 220 may then apply the laser component input current waveform to the laser component and may apply the modulator component input signal waveform (e.g., a voltage signal or a current signal) to the modulator component, thereby causing the laser and modulator components to emit selectively modulated light to illuminate a pixel in accordance with the pixel value (e.g., within an associated light power error range), which may be used to form the image.

Subsequently, the controller system 220 may obtain or receive a second light power demand or request, which may be associated with a second pixel value for forming the image. The controller system 220 may then determine a second laser component input current waveform and a second modulator component input signal waveform based upon the signal control route (e.g., by determining the laser component input current waveform and modulator component input signal waveform defined by the signal control route for achieving the second demanded or requested light power). The controller system 220 may then apply the second laser component input current waveform to the laser component and may apply the second modulator component input signal waveform to the modulator component, thereby causing the laser and modulator components to emit selectively modulated light to illuminate a second pixel in accordance with the second pixel value (e.g., within an associated light power error range), which may be used to form the image. In this regard, pixel values may be controlled by application of different laser currents and/or modulator signals on a per-pixel basis (see FIG. 7).

In some instances, the second laser component input current waveform and/or the second modulator component input signal waveform has/have different amplitude(s) than the laser component input current waveform and/or the modulator component input signal waveform associated with the first light power demand, respectively (e.g., according to the signal control route). In some instances, the second laser component input current waveform and/or the second modulator component input signal waveform has/have the same amplitude(s) as the laser component input current waveform and/or the modulator component input signal waveform associated with the first light power demand, respectively (e.g., according to the signal control route).

The light power demand may be associated with any number of pixel values for forming an image. For example, the light power demand may be associated with a plurality of pixel values (e.g., for a set of contiguous pixels or for an entire image frame). In some instances, the laser component input current waveform (selected in accordance with a signal control route based upon the light power demand) defines a single, particular input current amplitude for a set of contiguous pixel values (or an entire image frame). The particular input current amplitude may be applied and maintained to illuminate the contiguous pixels (e.g., without pulsing, see FIG. 12) or may be pulsed to illuminate the contiguous pixels (see FIG. 13). In some instances, the modulator component input signal waveform (selected in accordance with a signal control route based upon the light power demand) defines a single, particular input signal amplitude for a set of contiguous pixel values (or an entire image frame). The particular input signal amplitude may be applied and maintained to illuminate the contiguous pixels (e.g., without pulsing, see FIGS. 8 and 10) or may be pulsed to illuminate the contiguous pixels (see FIGS. 9 and 11).

Different signal control routes may be utilized for different operational conditions (e.g., system power consumption, such as whether the display device (e.g., HMD) is operating in a power saving mode). Furthermore, different signal control routes may be selected for different integrated laser and modulator devices controlled by a controller system 220. The implementation of a desired signal control route to control one or more (integrated) laser and modulator devices may contribute to a mitigation of light power error of output light (and consequently may contributed to improved dynamic range).

In conventional AR devices, a laser control scheme governs the output of target light power by the laser at each pixel to generate image frames of a video stream. Many laser control schemes exist for laser-based AR displays that utilize one or more MEMS scanning lasers. However, conventional laser control schemes are not necessarily applicable to integrated laser and modulator devices as described herein. The following discussion refers to multiple control schemes that are usable for integrated laser and modulator devices and that provide different levels of signal control flexibility, light error reduction, and/or dynamic range improvement. Different control schemes can be selected based upon modulator response time, the dynamic range requirement for the displayed content, etc.

As noted hereinabove, although some examples discussed herein focus, in at least some respects, on control of integrated laser and modulator devices, the control principles discussed herein may be utilized in conjunction with any type of laser and modulator device (e.g., where the laser and modulator are implemented as distinct entities/devices).

Figure 7:
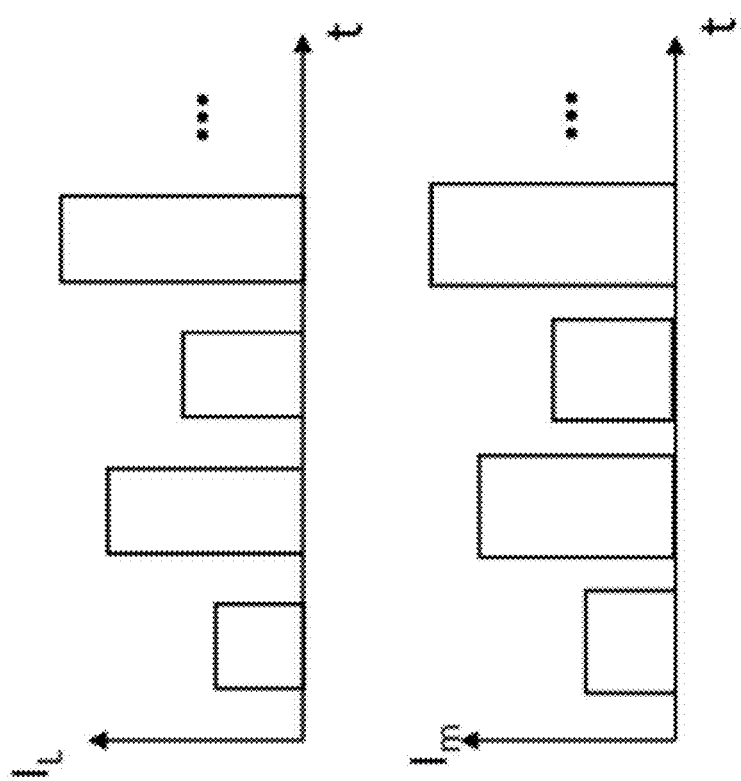
FIGS. 7 through 13 illustrate example graphs depicting various control schemes for controlling laser and modulator signal.

FIG. 7 illustrates a pixel-by-pixel control method, where both the laser component and the modulator component send individual pulses, and device signals are controlled to match target light level at each pixel (IL represents laser component input current and In, represents modulator component input signal). As shown in FIG. 7, the amplitude of the laser current and modulator signal can be changed from one pixel to the next. The pixel-by-pixel control method can provide significant flexibility in terms of signal control. As noted above, arbitrary signal-increasing routes can be chosen to meet specific requirements for light power error and power consumption. A pixel-by-pixel control scheme can be used when modulator and laser response times are fast enough to ensure that inter-symbol interference (ISI) effect is sufficiently small (e.g., so that, with some degree of pre-calibration and correction, the ISI effect be decreased to a level that would not impact the image quality).

In some instances, a modulator component's response time is not fast enough to implement a pixel-by-pixel control scheme. This can result from the distance of adjacent modulator pulses being smaller than the modulator component's response time, causing the modulator to operate at a transient state rather than a steady state. Therefore, a modulator pulse would have an amplification/attenuation number that is strongly dependent on its preceding pulse's parameters (e.g., not only its distance, but also its signal level). Such an effect can be regarded as a "modulator history effect". To address this effect, a control scheme that strategically sets the modulator into a steady state can be utilized.

Figure 8:
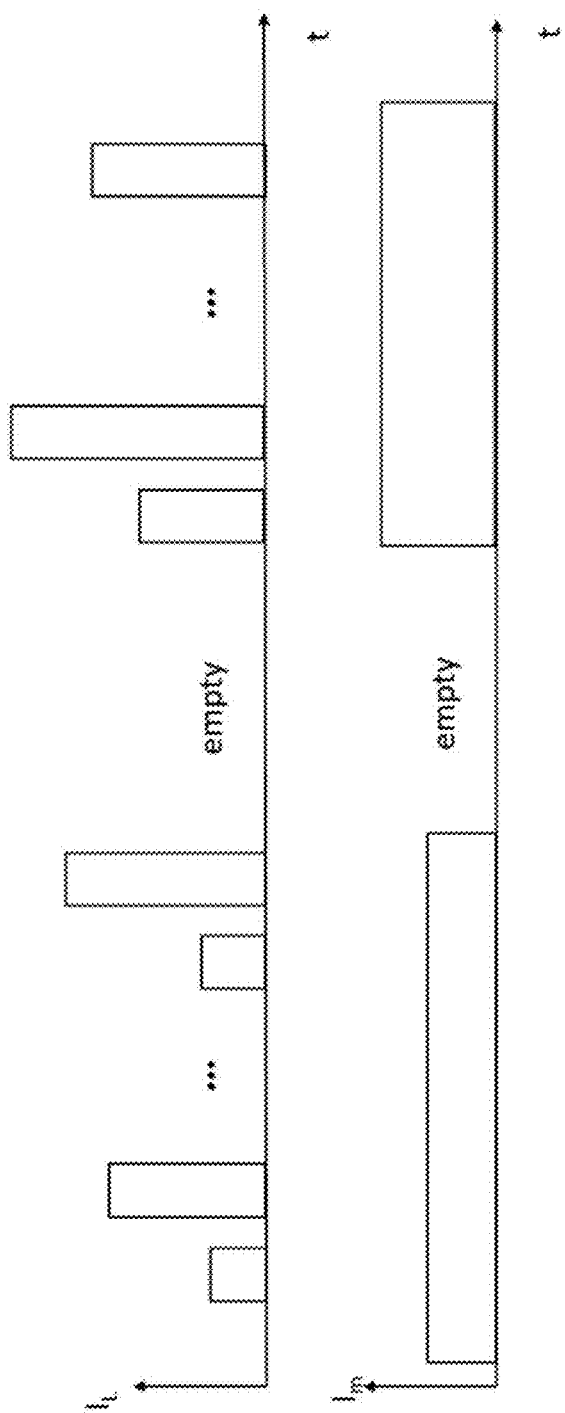

FIG. 8 illustrates a "smart on-off" control method, where a consistent modulator signal amplitude is applied for multiple contiguous pixels, and where the amplitude of the modulator signal is only adjusted during "empty" intervals that are longer than the response time of the modulator component. An empty interval includes a series of consecutive empty pixels (where no virtual imagery is being displayed). AR displays typically have sparse content density, making empty intervals a regular occurrence in AR content presentation. Empty intervals can be detected prior to sending the pulses, and the modulator's signal can be adjusted during such empty intervals.

According to the smart on-off control scheme shown in FIG. 8, the modulator would be in a steady state when a laser pulse is fired, thereby eliminating the need for ISI correction for the modulator's amplification/attenuation effect. However, the modulator component would be in an "on" state even when the laser is in an "off" state, which can result in higher power consumption and can even result in affected image quality (e.g., due to extra light output between adjacent pixels).

Figure 9:
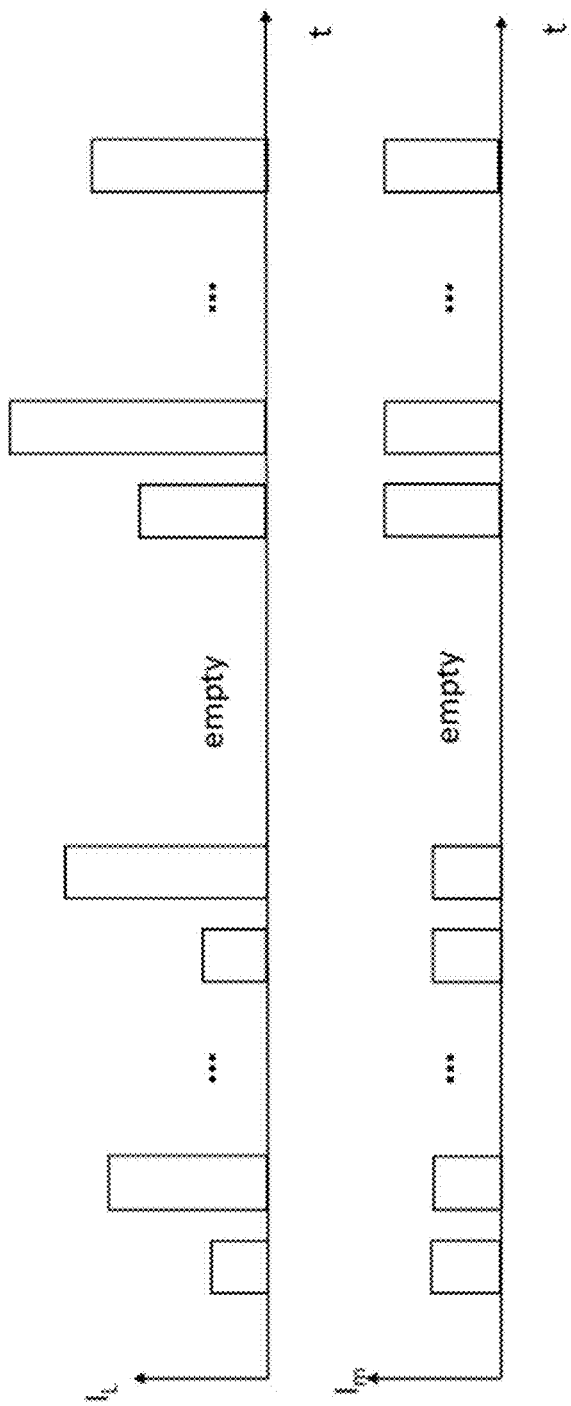

FIG. 9 illustrates an alternative smart on-off control scheme where the amplitude of the modulator signal is pulsed at the same rate as the laser component, while still only switching the amplitude of the modulator signal during empty intervals. According to the smart on-off control scheme shown in FIG. 9, if the modulator component's response time is longer than the time interval between adjacent pixels, the modulator component would be in a transient state during the laser pulses. However, ISE effect correction can be easily implemented to address the transience since preceding modulator pulses (without an intervening empty interval) would have the same signal level as the current pulse. ISI correction can be further simplified if the modulator signal amplitude is chosen from several pre-selected signal amplitudes. A smart on-off control scheme may be appropriate for blocks of active pixels when modulator component response time is not fast enough to achieve a pixel-by-pixel control scheme.

Figure 10:
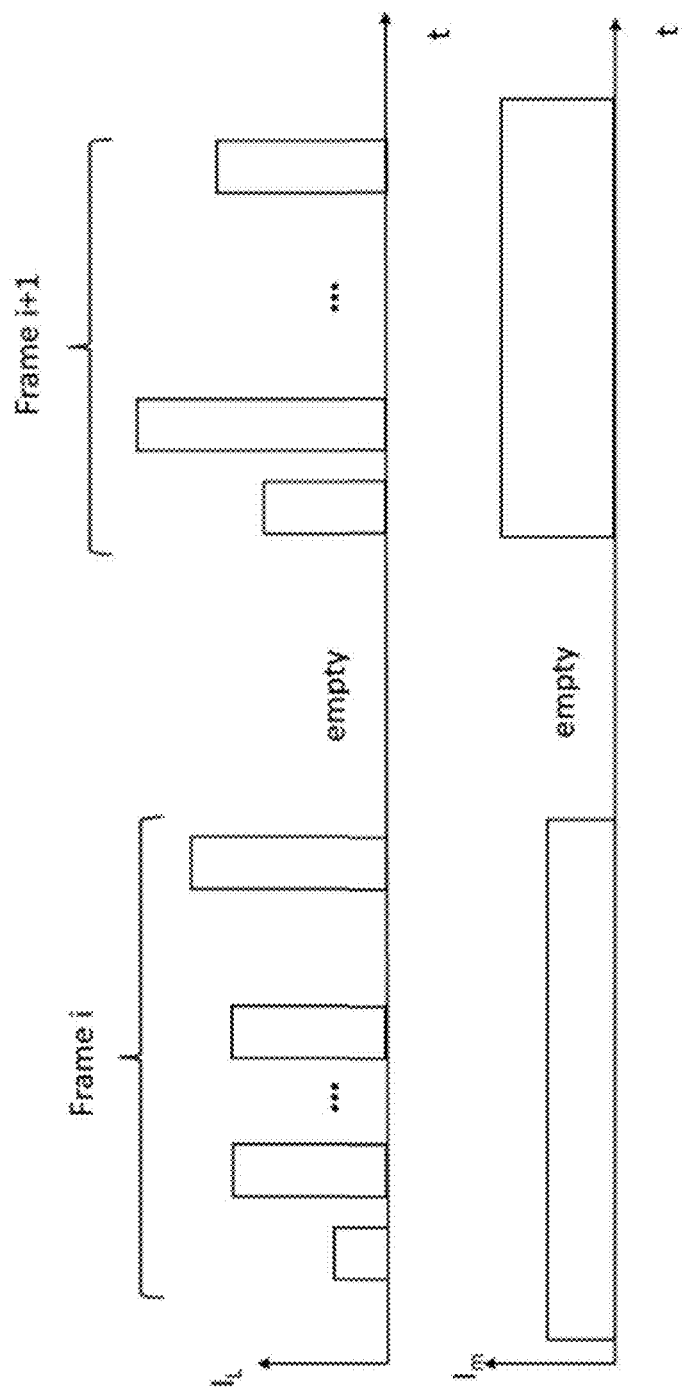
Figure 11:
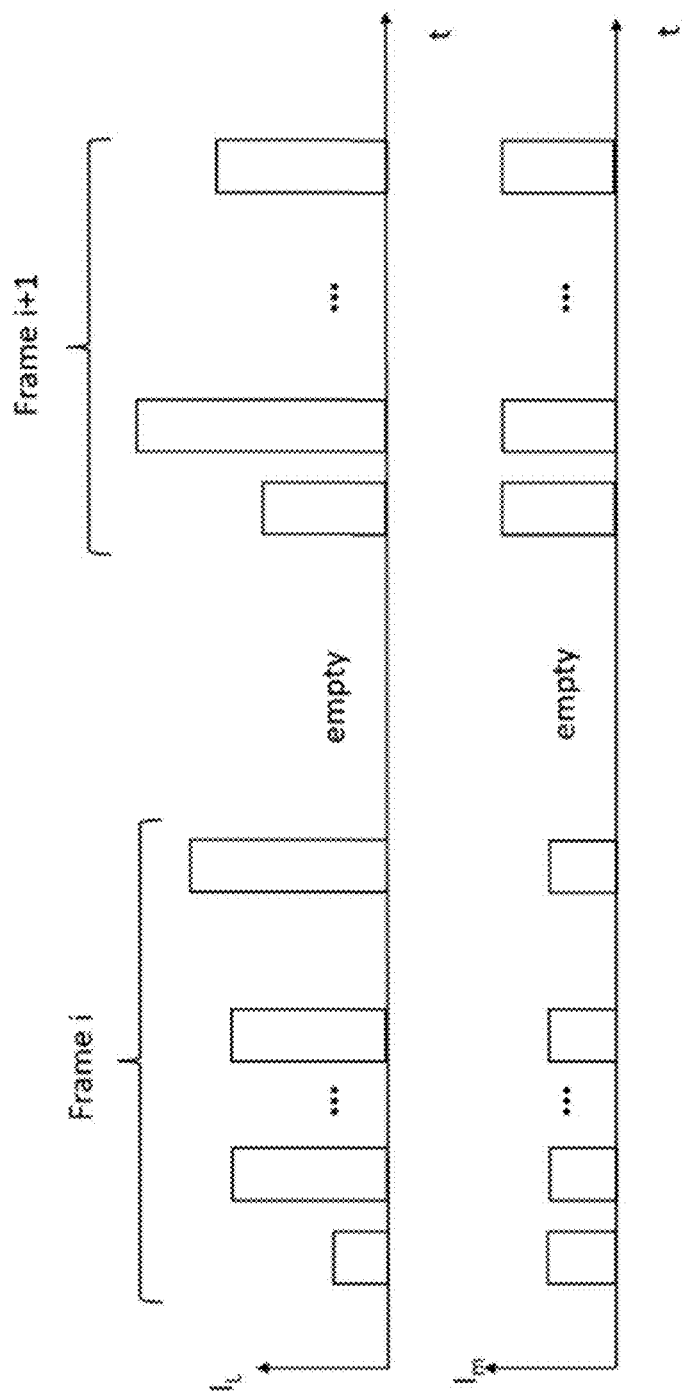

FIG. 10 illustrates a frame-by-frame control scheme, which is similar to the smart on-off control scheme described above with reference to FIGS. 8 and 9. In the frame-by-frame control scheme, the "empty" intervals comprise a time period between consecutive image frames of the presented video stream. The time period between consecutive image frames is typically long enough to enable changing of the modulator input signal amplitude and to allow the modulator to be in a steady state when laser pulses are fired. A frame-by-frame control scheme may be implemented where the modulator response time is too slow to implement a pixel-by-pixel control scheme or a smart on-off control scheme. FIG. 11 illustrates that the modulator component may be pulsed over the course of a frame at the selected modulator input signal amplitude for the frame (similar to the smart on-off control scheme of FIG. 9). The frame-by-frame control scheme may facilitate enhancement of inter-frame dynamic range.

Figure 12:
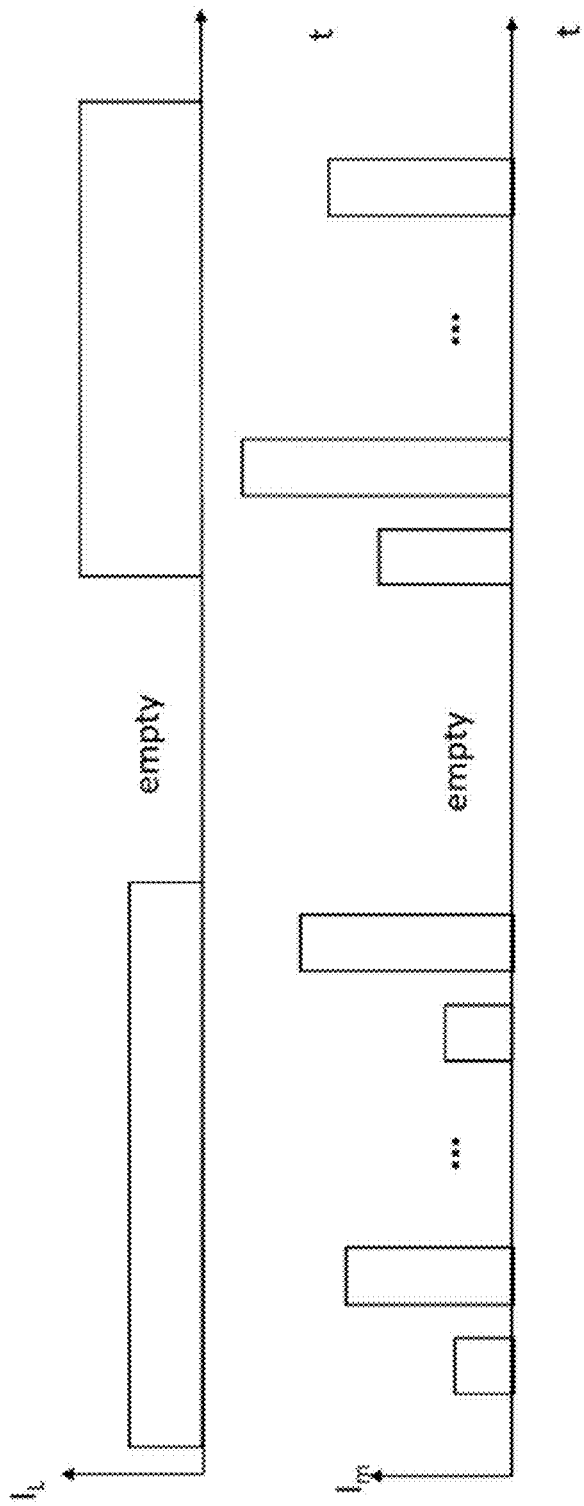
Figure 13:
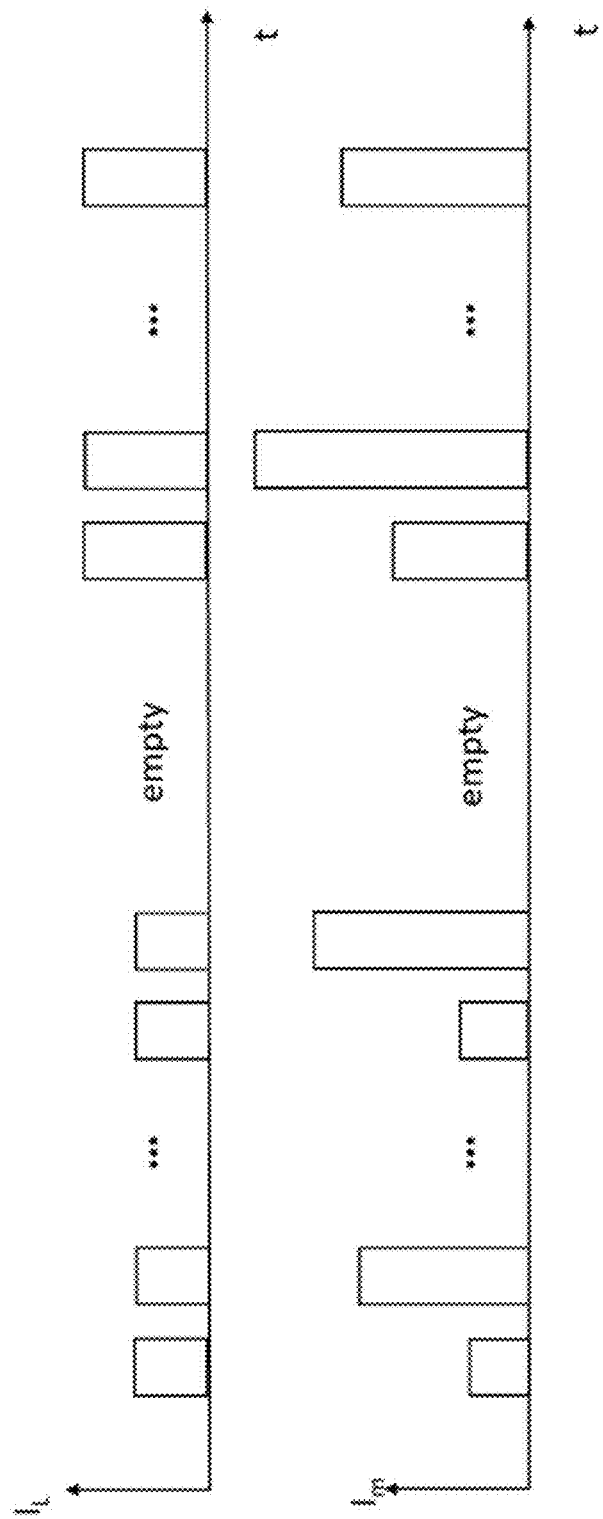

In implementations where the modulator component response is fast enough to resolve pulses at the nanosecond level, a modulator-centric control scheme may be adopted to help minimize laser current control error. Semiconductor optical amplifiers (SOAs) (which, as noted above, may be utilized as modulator components), typically have a fast response time (e.g., about 1 ns), making them good candidates for modulator-centric control schemes. In a modulator-concentric control scheme, the laser current amplitude is modified during empty intervals (or between consecutive frames), and the laser current amplitude may be applied over several consecutive pixels without pulsing (as shown in FIG. 12) or may be pulsed with the modulator component (as shown in FIG. 13). The laser current amplitude can be chosen from a plurality of several pre-selected current amplitudes.

Additional Details Related to Implementing the Disclosed Embodiments

Figure 14:
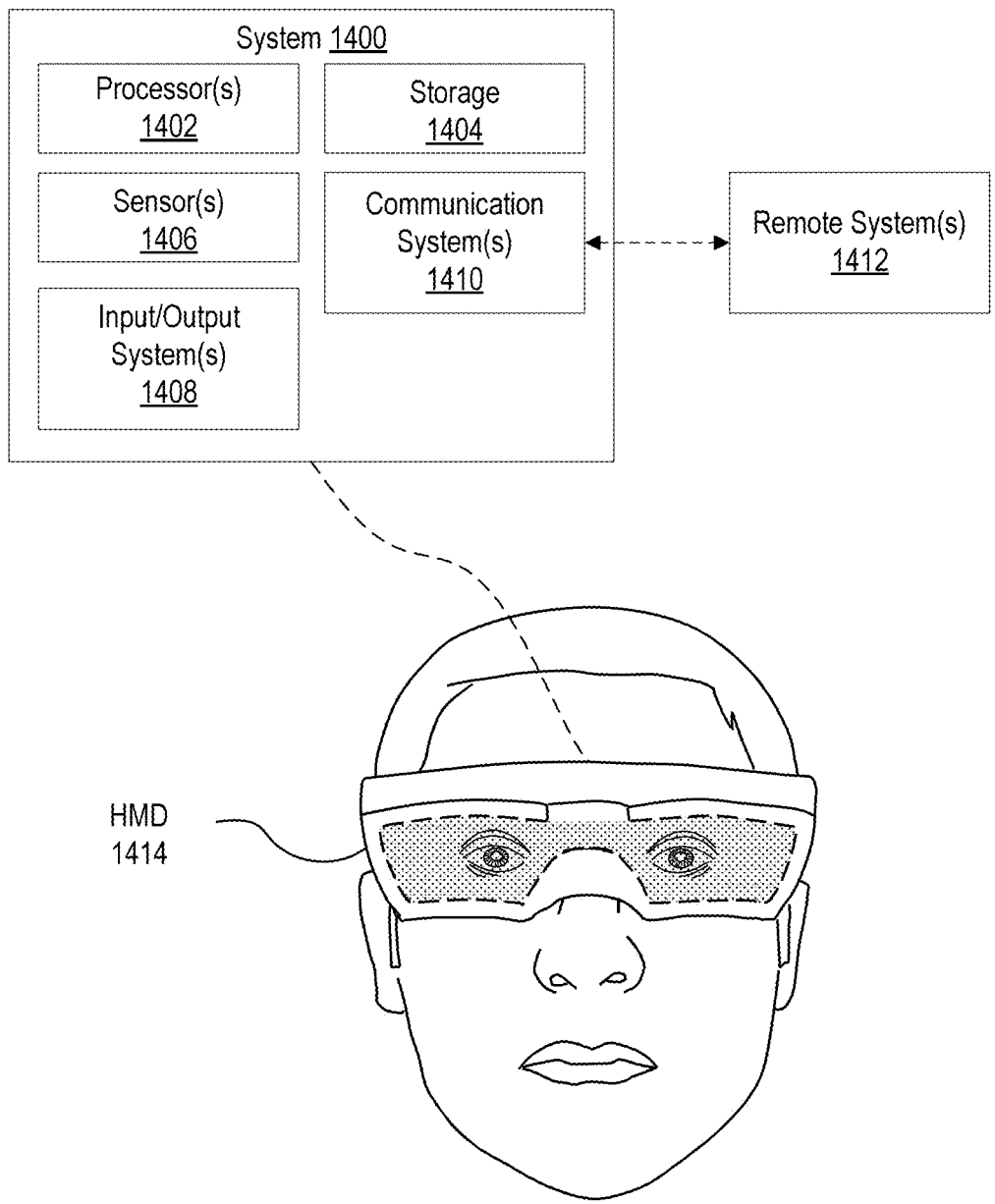
FIG. 14 illustrates example components of a system that may comprise or implement one or more disclosed embodiments.

FIG. 14 illustrates example components of a system 1400 that may comprise or implement aspects of one or more disclosed embodiments. FIG. 14 depicts the system 1400 as a head-mounted display 1414 (HMD 1414) configured for placement over a head of a user to display virtual content for viewing by the user. Such an HMD 1414 may comprise an augmented reality (AR) system, a virtual reality (VR) system, and/or any other type of HMD. Although the present disclosure focuses, in at least some respects, on a system 1400 implemented as an HMD 1414, it should be noted that the techniques described herein may be implemented using other types of systems/devices, without limitation.

FIG. 14 illustrates various example components of the system 1400. For example, FIG. 14 illustrates an implementation in which the system includes processor(s) 1402, storage 1404, sensor(s) 1406, I/O system(s) 1408, and communication system(s) 1410. Although FIG. 14 illustrates a system 1400 as including particular components, one will appreciate, in view of the present disclosure, that a system 1400 may comprise any number of additional or alternative components.

The processor(s) 1402 may comprise one or more sets of electronic circuitries that include any number of logic units, registers, and/or control units to facilitate the execution of computer-readable instructions (e.g., instructions that form a computer program). Such computer-readable instructions may be stored within storage 1404. The storage 1404 may comprise physical system memory and may be volatile, non-volatile, or some combination thereof. Furthermore, storage 1404 may comprise local storage, remote storage (e.g., accessible via communication system(s) 1410 or otherwise), or some combination thereof. Additional details related to processors (e.g., processor(s) 1402) and computer storage media (e.g., storage 1404) will be provided hereinafter.

As will be described in more detail, the processor(s) 1402 may be configured to execute instructions stored within storage 1404 to perform certain actions. In some instances, the actions may rely at least in part on communication system(s) 1410 for receiving data from remote system(s) 1412, which may include, for example, separate systems or computing devices, sensors, and/or others. The communications system(s) 1410 may comprise any combination of software or hardware components that are operable to facilitate communication between on-system components/devices and/or with off-system components/devices. For example, the communications system(s) 1410 may comprise ports, buses, or other physical connection apparatuses for communicating with other devices/components. Additionally, or alternatively, the communications system(s) 1410 may comprise systems/components operable to communicate wirelessly with external systems and/or devices through any suitable communication channel(s), such as, by way of non-limiting example, Bluetooth, ultra-wideband, WLAN, infrared communication, and/or others.

FIG. 14 illustrates that a system 1400 may comprise or be in communication with sensor(s) 1406. Sensor(s) 1406 may comprise any device for capturing or measuring data representative of perceivable phenomenon. By way of non-limiting example, the sensor(s) 1406 may comprise one or more image sensors, microphones, thermometers, barometers, magnetometers, accelerometers, gyroscopes, and/or others.

Furthermore, FIG. 14 illustrates that a system 1400 may comprise or be in communication with I/O system(s) 1408. I/O system(s) 1408 may include any type of input or output device such as, by way of non-limiting example, a touch screen, a mouse, a keyboard, a controller, and/or others, without limitation. For example, the I/O system(s) 1408 may include a display assembly (e.g., as described hereinabove) that may comprise any number of display panels, optics, laser-based scanning display assemblies (e.g., similar to the system shown and described with reference to FIG. 2), and/or other components.

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are one or more "physical computer storage media" or "hardware storage device(s)."

Computer-readable media that merely carry computer-executable instructions without storing the computer-executable instructions are "transmission media." Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SSD") that are based on RAM, Flash memory, phase-change memory ("PCM"), or other types of memory, or other optical disk storage, magnetic disk storage or other magnetic storage devices, or any other medium that can be used to store desired program code means in hardware in the form of computer-executable instructions, data, or data structures and that can be accessed by a general-purpose or special-purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Disclosed embodiments may comprise or utilize cloud computing. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Those skilled in the art will appreciate that at least some aspects of the invention may be practiced in network computing environments with many types of computer system configurations, including, personal computers, desktop computers, laptop computers, message processors, hand-held devices, multi-processor systems, microprocessor-based or programmable consumer electronics, network PCs, mini-computers, mainframe computers, mobile telephones, PDAs, pagers, routers, switches, wearable devices, and the like. The invention may also be practiced in distributed system environments where multiple computer systems (e.g., local and remote systems), which are linked through a network (either by hardwired data links, wireless data links, or by a combination of hardwired and wireless data links), perform tasks. In a distributed system environment, program modules may be located in local and/or remote memory storage devices.

Alternatively, or in addition, at least some of the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), central processing units (CPUs), graphics processing units (GPUs), and/or others.

As used herein, the terms "executable module," "executable component," "component," "module," or "engine" can refer to hardware processing units or to software objects, routines, or methods that may be executed on one or more computer systems. The different components, modules, engines, and services described herein may be implemented as objects or processors that execute on one or more computer systems (e.g., as separate threads).

One will also appreciate how any feature or operation disclosed herein may be combined with any one or combination of the other features and operations disclosed herein. Additionally, the content or feature in any one of the figures may be combined or used in connection with any content or feature used in any of the other figures. In this regard, the content disclosed in any one figure is not mutually exclusive and instead may be combinable with the content from any of the other figures.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A display system, comprising:
   an integrated laser and modulator device, the integrated laser and modulator device comprising:
   a laser component configured to facilitate light emission responsive to applied current;
   a modulator component configured to selectively modulate light responsive to applied signal, the modulator component being integrally coupled to the laser component via a bridging structure that intervenes between the laser component and the modulator component, wherein at least a portion of the bridging structure facilitates power reflectivity into a laser cavity of the laser component, wherein the bridging structure facilitates coupling of light emitted by the laser component into the modulator component for modulation by the modulator component to provide modulated light, wherein the bridging structure comprises an etched notch with different coatings disposed over opposing walls of the etched notch, and wherein the modulator component comprises a tapered waveguide for mitigating coupling loss between the laser component and the modulator component across the bridging structure; and
   a display assembly configured to direct the modulated light provided by the integrated laser and modulator device to illuminate pixels to form an image, wherein modulation by the modulator component of the light emitted by the laser component mitigates effects of light power error associated with the laser component.

2. The display system of claim 1, wherein the mitigation of effects of light power error associated with the laser component contributes to an increased dynamic range of the image.

3. The display system of claim 1, wherein the modulator component is configured to selectively attenuate light responsive to applied voltage such that the modulated light comprises attenuated light.

4. The display system of claim 1, wherein the modulator component is configured to selectively amplify light responsive to applied current such that the modulated light comprises amplified light.

5. The display system of claim 1, wherein the laser component and the modulator component of the integrated laser and modulator device are independently controllable to enable application of different amounts of current to the laser component and the modulator component.

6. The display system of claim 1, wherein the display assembly comprises a scanner mirror configured to reflect the modulated light to illuminate the pixels to form the image.

7. The display system of claim 6, wherein the display assembly further comprises a waveguide configured to receive reflected light from the scanner mirror and to internally reflect received light, the waveguide comprising one or more coupling elements configured to outcouple the received light toward an eye of a user.

8. The display system of claim 1, wherein the bridging structure comprises one or more integrated freeform optical couplers.

9. The display system of claim 1, wherein the bridging structure comprises one or more free space optical couplers.

10. A laser and modulator system, comprising:
    a laser component configured to facilitate light emission responsive to applied current;
    a modulator component configured to selectively modulate light responsive to applied current or voltage, the modulator component being configured to receive and selectively modulate light emitted by the laser component to provide modulated light, wherein the laser component and the modulator component are independently controllable to enable application of different input current or voltage signals to the laser component and the modulator component; and
    a controller system configured to selectively modify current applied to the laser component and current or voltage to the modulator component in accordance with a signal control route, the signal control route defining different combinations of laser component input current waveform and modulator component input signal waveform for different light power demands, wherein implementation of the signal control route for determining laser component input current waveform and modulator component input signal waveform based upon light power demand contributes to a mitigation of light power error for modulated light output by the laser and modulator system, wherein the light power demand is associated with a plurality of pixel values for forming an image, and wherein the laser component input current waveform defines a particular input current amplitude for a set of contiguous pixel values of the plurality of pixel values, and wherein applying the modulator component input signal waveform to the modulator component comprises pulsing the particular input signal amplitude while applying the laser component input current waveform to the laser component to illuminate a set of contiguous pixels in accordance with the set of contiguous pixel values to form the image.

11. The laser and modulator system of claim 10, wherein the controller system comprises:
one or more processors; and
one or more hardware storage devices that store instructions that are executable by the one or more processors to configure the controller system to:
  obtain a light power demand;
  based upon the signal control route, determine a laser component input current waveform and a modulator component input signal waveform;
  apply the laser component input current waveform to the laser component; and
  apply the modulator component input signal waveform to the modulator component.

12. The laser and modulator system of claim 11, wherein the instructions are executable by the one or more processors to further configure the controller system to:
  obtain a second light power demand;
  based upon the signal control route, determine a second laser component input current waveform and a second modulator component input signal waveform;
  apply the second laser component input current waveform to the laser component; and
  apply the second modulator component input signal waveform to the modulator component.

13. The laser and modulator system of claim 12, wherein (i) the second laser component input current waveform comprises a different amplitude than the laser component input current waveform or (ii) the second modulator component input signal waveform comprises a different amplitude than the modulator component input signal waveform.

14. The laser and modulator system of claim 12, wherein the light power demand is associated with a pixel value for forming an image, and wherein applying the laser component input current waveform to the laser component and applying the modulator component input signal waveform to the modulator component causes the laser and modulator system to emit modulated light to illuminate a pixel in accordance with the pixel value to form the image.

15. The laser and modulator system of claim 14, wherein the second light power demand is associated with a second pixel value for forming the image, and wherein applying the second laser component input current waveform to the laser component and applying the second modulator component input signal waveform to the modulator component causes the laser and modulator system to emit second modulated light to illuminate a second pixel in accordance with the second pixel value to form the image.

16. A laser and modulator system, comprising:
a laser component configured to facilitate light emission responsive to applied current;
a modulator component configured to selectively modulate light responsive to applied current or voltage, the modulator component being configured to receive and selectively modulate light emitted by the laser component to provide modulated light, wherein the laser component and the modulator component are independently controllable to enable application of different input current or voltage signals to the laser component and the modulator component; and
a controller system configured to selectively modify current applied to the laser component and current or voltage to the modulator component in accordance with a signal control route, the signal control route defining different combinations of laser component input current waveform and modulator component input signal waveform for different light power demands, wherein implementation of the signal control route for determining laser component input current waveform and modulator component input signal waveform based upon light power demand contributes to a mitigation of light power error for modulated light output by the laser and modulator system, and wherein the light power demand is associated with a plurality of pixel values for forming an image, and wherein the modulator component input signal waveform defines a particular input signal amplitude for a set of contiguous pixel values of the plurality of pixel values, and wherein applying the laser component input current waveform to the laser component comprises pulsing the particular input current amplitude while applying the modulator component input signal waveform to the modulator component to illuminate a set of contiguous pixels in accordance with the set of contiguous pixel values to form the image.

17. A display system, comprising:
an integrated laser and modulator device, the integrated laser and modulator device comprising:
  a laser component configured to facilitate light emission responsive to applied current;
  a modulator component configured to selectively modulate light responsive to applied signal, the modulator component being integrally coupled to the laser component via a bridging structure that intervenes between the laser component and the modulator component, wherein at least a portion of the bridging structure facilitates power reflectivity into a laser cavity of the laser component, wherein the bridging structure facilitates coupling of light emitted by the laser component into the modulator component for modulation by the modulator component to provide modulated light, wherein the bridging structure comprises one or more integrated freeform optical couplers; and
a display assembly configured to direct the modulated light provided by the integrated laser and modulator device to illuminate pixels to form an image, wherein modulation by the modulator component of the light emitted by the laser component mitigates effects of light power error associated with the laser component.

* * * * *